(12) United States Patent  
Stubbs

(10) Patent No.: US 7,116,589 B2
(45) Date of Patent: *Oct. 3, 2006

(54) PER-BIT SET-UP AND HOLD TIME ADJUSTMENT FOR DOUBLE-DATA RATE SYNCHRONOUS DRAM

(75) Inventor: Eric T. Stubbs, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 121 days.

This patent is subject to a terminal disclaimer.

(21) Appl. No.: 10/952,677

(22) Filed: Sep. 29, 2004

(65) Prior Publication Data

US 2005/0057978 A1 Mar. 17, 2005

Related U.S. Application Data

(63) Continuation of application No. 09/994,205, filed on Nov. 26, 2001, now Pat. No. 6,838,712.

(51) Int. Cl.
*G11C 7/22* (2006.01)
*G11C 7/10* (2006.01)

(52) U.S. Cl. ............... 365/194; 365/193; 365/233; 365/189.05

(58) Field of Classification Search ........ 365/189.05, 365/193, 194, 233
See application file for complete search history.

(56) References Cited

U.S. PATENT DOCUMENTS

| | | | |
|---|---|---|---|
| 5,657,481 A | 8/1997 | Farmwald et al. | 713/400 |
| 5,692,165 A | 11/1997 | Jeddeloh et al. | 713/400 |
| 5,694,065 A | 12/1997 | Hamasaki et al. | 327/108 |
| 5,813,023 A | 9/1998 | McLaury | 711/105 |
| 5,896,347 A * | 4/1999 | Tomita et al. | 365/233 |
| 5,920,518 A | 7/1999 | Harrison et al. | 365/233 |
| 6,040,713 A | 3/2000 | Porter et al. | 326/83 |
| 6,130,856 A | 10/2000 | McLaury | 365/233 |
| 6,137,334 A | 10/2000 | Miller, Jr. et al. | 327/271 |
| 6,154,418 A | 11/2000 | Li | 365/233 |
| 6,166,973 A * | 12/2000 | Shinozaki | 365/200 |
| 6,201,424 B1 | 3/2001 | Harrison | 327/159 |
| 6,229,757 B1 * | 5/2001 | Nagata et al. | 365/233 |
| 6,282,132 B1 | 8/2001 | Brown et al. | 365/193 |
| 6,333,875 B1 * | 12/2001 | Shinozaki | 365/193 |
| 6,434,081 B1 | 8/2002 | Johnson et al. | 36/233 |
| 6,838,712 B1 * | 1/2005 | Stubbs | 257/208 |
| 2002/0149992 A1 * | 10/2002 | Faue | 365/233 |

* cited by examiner

*Primary Examiner*—J. H. Hur
(74) *Attorney, Agent, or Firm*—Wong Cabello Lutsch Rutherford and Brucculeri

(57) ABSTRACT

A synchronous double-data-rate semiconductor memory device is adapted to receive write data on both the rising and falling edges of a data strobe signal derived from an externally-applied system clock. In the write path circuitry for each data pin of the device, adjustable delay elements are provided to enable the adjustment of the setup and hold times of write data applied to the data pin relative to the data strobe signal. The delays are separately adjustable for data present during the rising edge of the data strobe signal and for data present during the falling edge of the data strobe signal. The setup and hold window for write data is thus optimizable on a per-bit basis rather than a per-cycle basis. In one embodiment, a delay circuit is provided for generating delaying the rising edge data and the falling edge data by different delay intervals.

86 Claims, 4 Drawing Sheets

PER-BIT SET-UP AND HOLD TIME ADJUSTMENT FOR DOUBLE-DATA RATE SYNCHRONOUS DRAM

CROSS REFERENCE TO RELATED APPLICATIONS

This application is a continuation of U.S. application Ser. No. 09/994,205, filed Nov. 26, 2001 now U.S. Pat. No. 6,838,712, which is incorporated herein by reference in its entirety, and to which priority is claimed.

FIELD OF THE INVENTION

This invention relates generally to semiconductor devices, and more particularly relates to synchronous semiconductor memory devices.

BACKGROUND OF THE INVENTION

The field of semiconductor memory devices is enormously active and rapidly developing. Various categories and sub-categories of semiconductor devices are known and commercially available. The ever-increasing popularity and ubiquity of computers and computer-based devices, both in the consumer and industrial realms, is such that the demand for semiconductor memory devices of a variety of different types will continue to grow for the foreseeable future.

One of the more common categories of semiconductor memory devices used today is the dynamic random access memory, or DRAM. Among the desirable characteristics of any DRAM are a high storage capacity per unit area of semiconductor die area, fast access speeds, low power consumption, and low cost.

One approach that has been used to optimize the desirable properties of DRAMs has been to design such devices such that they are accessible synchronously. A synchronous DRAM typically requires an externally-applied clocking signal, as well as other externally-applied control signals whose timing must bear certain predetermined relationships with the clock signal. Likewise, digital data is read from and written to a synchronous memory device in a synchronous relationship to the externally-applied clock signal. Synchronous DRAM technologies have been under development for many years, and synchronous DRAMs (frequently referred to as "SDRAMs") are used in a broad spectrum of commercial and industrial applications, including the personal computer industry.

In typical implementations, the external clock signal CLK comprises a simple, periodic "square" wave oscillating with reasonably uniform periodicity between a logical high voltage level (for example, 3.3V) and a logical low level (typically 0V) with a duty cycle of 50% (meaning that the signal is at a logical "high" level the same amount of time that it is at a logical "low" level during each complete clock cycle). In present state-of-the-art semiconductor devices, the clock signal may have a frequency on the order of hundreds of megahertz.

A synchronous semiconductor device such as a SDRAM will typically require an external input signal such as a clock signal to be provided to several (or even numerous) separate but interrelated functional subcircuits of the device. As a matter of ordinary semiconductor device layout, it is typical for each of the separate subcircuits of an overall device to be physically disposed at different and perhaps distributed locations throughout the substrate as a whole. This means that the conductive lengths, and hence such characteristics as capacitive and complex impedance loads of the various conductive traces which carry electrical signals throughout the substrate, will vary from signal to signal. Hence, for example, the propagation delay of a clock signal from a clock signal input pin to one functional subcircuit may be different than the propagation delay to another functional subcircuit; such differences can be critical for devices operating at very high clock rates, on the order of 100 MHz or so (and perhaps less).

To address such considerations, an approach referred to as "delay-locked loop" or "DLL" can be employed. In a simple example of DLL implementation, an externally-applied clock signal CLK is applied to an input pin of a memory device, and ultimately is applied to a DLL block. The DLL block operates to derive a plurality of separate internal clock signals which are then provided to the various subcircuits of memory device on various lines. The function of DLL block (which may be distributed throughout the area of the substrate) is to adjust the relative timing of the clock signals provided on the lines to the various distributed subcircuits of the device such that overall synchronous operation of the device can be achieved.

DLL blocks may utilize some type of loop-back operation, whereby the DLL block is provided with feedback for comparing the timing of the clock signal supplied to a command block with the timing of the external clock signal CLK. Since a command input buffer and a data input buffer on the memory device each receive and operate based on a clock signal, the command input pins and data input pins are said to be synchronous inputs. As such, binary data applied to such input pins will only be stored in respective buffers (a process sometimes referred to as "signal capture") upon a rising or falling edge of the corresponding internal clock signal.

As a result of the functionality of a typical DLL circuit, if the propagation and loading characteristics of the lines varies significantly, the DLL circuit can account for such differences to ensure that proper device operation can be maintained. Internally to the DLL circuit, separate delays and skews (programmable, or automatically adjusted) may be introduced into the externally-applied clock signal to ensure that each of the other functional blocks in the device receives clock signals that are substantially synchronized with the others. The delays and skews introduced by a DLL may be miniscule, on the order of picoseconds, but may be nonetheless critical to the proper operation of a semiconductor device.

The functionality of DLLs can be thought of generally as a process of internal clock signal generation, and those of ordinary skill in the art will doubtless be familiar at least generally with the concept of DLLs in semiconductor devices. Various examples of DLL implementations for synchronous memory devices are proposed in U.S. Pat. No. 5,920,518 to Harrison et al., entitled "Synchronous Clock Generator Including Delay-Locked Loop;" U.S. Pat. No. 6,201,424 to Harrison, entitled "Synchronous Clock Generator including a Delay-Locked Loop Signal-Loss Detector;" and U.S. Pat. No. 6,130,856 to McLaury, entitled "Method and Apparatus for Multiple Latency Synchronous Dynamic Random Access Memory." The aforementioned '518, '424, and '856 patents are each commonly assigned to the Assignee of the present invention and each are hereby incorporated by reference herein in their respective entireties.

Those of ordinary skill in the art will appreciate that in conventional synchronous DRAMs, data presented to the data input/output (DQ) pins are written into a data buffer during either the rising or falling edge of the external clock signal. On the other hand, a recent development in the evolution of synchronous DRAM technology is the so-called "double data rate (DDR) DRAM. In DDR DRAMs, data is written into data buffers on both the rising and falling edges of each clock cycle, thus providing twice as much data as a conventional SDRAM for a given system clock speed. One example of a DDR SDRAM is disclosed in U.S. Pat. No. 6,154,418 to Li, entitled "Write Scheme for a Double Data Rate SDRAM," which is commonly assigned to the assignee of the present invention and hereby incorporated by reference herein in its entirety.

Due to the high speed data transfers, DDR SDRAMs use a bi-directional data strobe signal (DQS) to register the data being input or output on both edges (rising and falling) of a system clock. According to industry standards, when data is being received by a DDR SDRAM, the DQS has a known latency which can vary between ¾ of a system clock cycle (minimum latency) to 5/4 of the clock cycle (maximum latency). When data is being received by a DDR SDRAM, the system clock cannot be properly synchronized with the DQS because of the latency variation and thus, the system clock cannot be properly synchronized with the input data.

Two parameters of significance to the process of writing data to a DDR DRAM are the setup and hold times specified for the data that is presented to the input buffer. The setup time (DS) is the minimum time in advance of the latching clock (data strobe) edge that valid data must be present at the input buffer's input. The hold time (DH) is the minimum time following the latching clock edge that the data must be present at the input buffer's input. Together, the setup and hold times define a "window" surrounding the data clock edge (rising or falling) during which the data on the data line (DQ) must be valid.

One scheme for clocking data into a DDR DRAM uses a delay element in the write data path to internally delay data relative to the data strobe. By making the delay element variable, the input setup and hold times can be adjusted to ensure that specified setup and hold times are achieved. However, experimental data shows that the setup and hold window can be different for the data clocked in on the rising edge than for the data clocked in on the falling edge. The net effect of this phenomenon is that the total setup and hold window for the input pin is the overlap of the windows for the two clock edges, which can be larger than permissible according to the memory device's specification. Adjustments to the single delay element can help the worst-case setup or hold, but improvement to one (setup or hold) can only be achieved to the detriment of the other.

Thus, it is believed that there remains a need for an improved method and apparatus by which data is clocked in to a DDR DRAM.

SUMMARY OF THE INVENTION

The present invention relates to an apparatus and corresponding method by which data is written to a synchronous, double-data-rate semiconductor memory device.

In accordance with one aspect of the invention, a write data path circuit is provided for each input/output terminal of the memory. The write data path circuit includes an input buffer having an output coupled to respective inputs of first and second adjustable delay elements. The output of the first and second delay elements, in turn, are coupled to respective first and second pass gates. The pass gates operate to open and close in response to a data strobe signal applied to a control input. The delay value of the first delay is adjustable to allow a first bit of data applied to the input/output terminal to appear at the input of the first pass gate in a predetermined timed relationship with a rising edge in the data strobe signal, such relationship corresponding to the specified setup and hold window for the device. Similarly, the delay value of the second delay is adjustable to allow a second bit of data applied to the input/output terminal to appear at the input of the second pass gate in a predetermined timed relationship with a falling edge of the data strobe signal, this relationship again corresponding to the specified setup and hold window for the device.

In accordance with another aspect of the invention, a delay circuit is provided having an input coupled to the input buffer associated with a data input/output terminal, and having first and second outputs coupled to the respective inputs of the first and second pass gates. The delay circuit comprises a plurality of individual, series-connected delay elements, with a plurality of tap points being defined between adjacent pair of delay elements. Each tap point can be shunted to either the input of the first pass gate or the input of the second pass gate. The amount of delay introduced into propagation of the rising edge data depends upon which tap point is shunted to the input of the first pass gate, whereas the amount of delay introduced into propagation of the falling edge data depends upon which tap point is shunted to the input of the second pass gate. In this way, one group of series-connected delay elements is utilized to generate two separately delayed signals.

BRIEF DESCRIPTION OF THE DRAWINGS

The foregoing and other features and aspects of the present invention will be best understood with reference to the following detailed description of a specific embodiment of the invention, when read in conjunction with the accompanying drawings, wherein.

DETAILED DESCRIPTION OF SPECIFIC EMBODIMENTS OF THE INVENTION

In the disclosure that follows, in the interest of clarity, not all features of actual implementations are described. It will of course be appreciated that in the development of any such actual implementation, as in any such project, numerous engineering and programming decisions must be made to achieve the developers' specific goals and subgoals (e.g., compliance with system and technical constraints), which will vary from one implementation to another. Moreover, attention will necessarily be paid to proper engineering practices for the environment in question. It will be appreciated that such a development effort might be complex and time-consuming, but would nevertheless be a routine undertaking for those of ordinary skill in the relevant fields.

Figure 1:
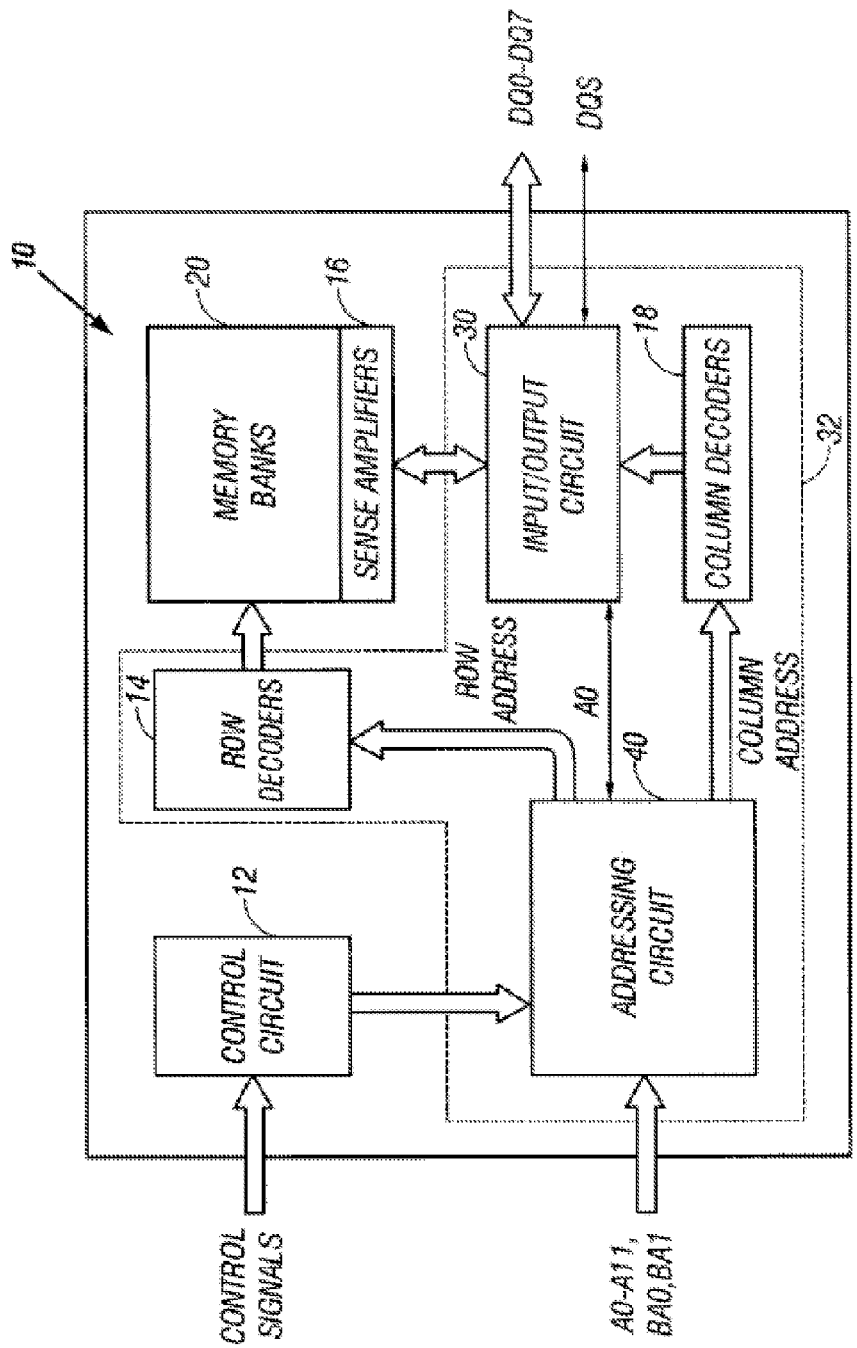
FIG. 1 is a schematic/block diagram of a semiconductor memory device in accordance with one embodiment of the invention.

Referring to FIG. 1, there is shown a highly simplified schematic/block diagram of a semiconductor memory device 10 in accordance with one embodiment of the invention. In the disclosed embodiment, memory device 10 is a double data rate (DDR) synchronous dynamic random access memory (SDRAM), although those of ordinary skill in the art having the benefit of the present disclosure will appreciate that the invention may not be limited in scope to application in SDRAM only. It will also be understood that SDRAM 10 incorporates a substantial amount of circuitry in addition to those functional components specifically represented in FIG. 1. However, such other circuitry has been omitted in the interests of brevity and clarity, since such circuitry is well-known to those of ordinary skill in the art and is not especially relevant to the practice of the present invention.

Memory device 10 includes a control circuit 12, addressing circuit 40, input/output circuit 30, memory banks 20, sense amplifier circuits 16, column decoders 18 and row decoders 14. In a preferred embodiment, four memory banks 20, sense amplifier circuits 16, column decoders 18 and row decoders 14 are used, but for convenience purposes, FIG. 1 illustrates only one memory bank 20, sense amplifier circuit 16, column decoder 18 and row decoder 14. In a preferred embodiment, four memory banks 20 are used, but it must be noted that the present invention can utilize, for example, one, two, four, eight or more memory banks 20. The row and column decoders 14, 18, addressing circuit 30 and input/output logic circuit 30 comprise a write path circuit 32 providing a data path for writing data into the banks 20 from an external device (through input/output pins DQ0–DQ7). It is to be noted that the illustrated configuration of the write path circuit 32 is but one of many possible configurations and the invention is not to be so limited to the specific circuit illustrated in FIG. 1.

In one embodiment, memory device 10 contains eight input/output pins DQ0–DQ7. This is referred to as a "by 8" device since eight bits are input or output at one time. It must be noted that the SDRAM 10 can also be configured to have fewer than eight input/output pins (e.g., a "by 4" device) or greater than eight input/output pins (e.g., a "by 16" device).

Control circuit 12 is coupled to address circuit 40 and receives various external control signals as inputs. By way of example but not limitation, control circuit 12 may receive a chip select (CS#) signal and a RESET signal, row and column address strobe (RAS and CAS) signals, a write enable (WE#) signal, and so on. Those of ordinary skill in the art will be familiar with the various control signals applied to device 10. Although not shown in FIG. 1, control circuitry 12 is likely to be coupled to most of the other functional components of device 10, in a conventional arrangement, such that control circuitry 12 is capable of interpreting the various control signals applied thereto and drive and control the overall operation of the remaining circuitry in device 10.

It is to be understood that although the various functional components of device 10 depicted in FIG. 1 are shown as separate, discrete circuits disposed in a well-defined spatial relationship with respect to one another, in actual implementation, the various circuits are likely to be dispersed throughout part or all of the semiconductor substrate, with portions of certain functional components being interspersed with one another. That is, FIG. 1 depicts device 10 from a functional perspective rather than an implementation-specific perspective.

Figure 2:
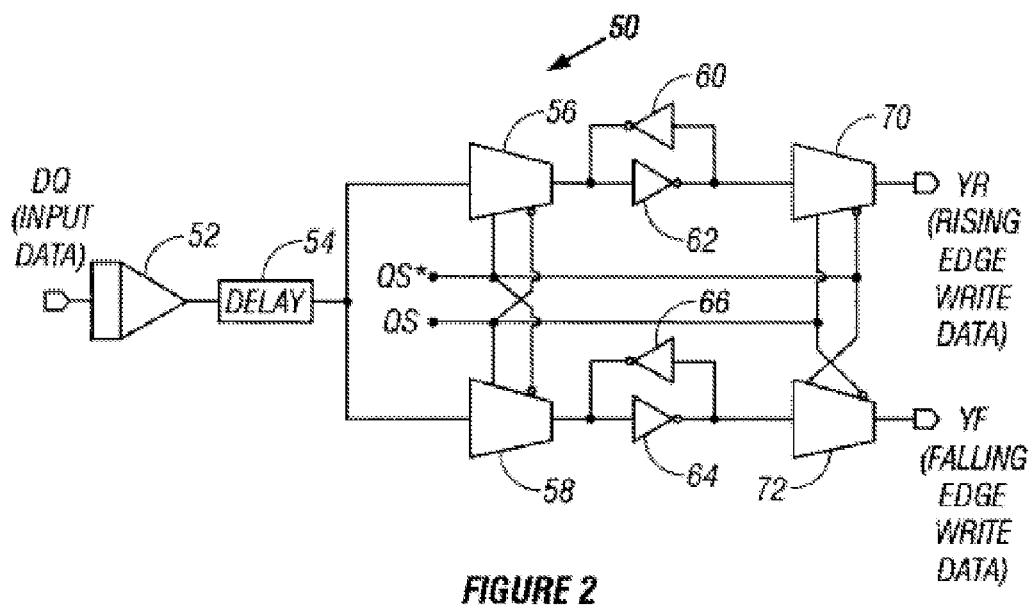
FIG. 2 is a schematic/block diagram of a portion of write data path circuitry in a prior art memory device.

Turning now to FIG. 2, there is shown a simplified schematic diagram of a portion of a prior art write path circuit 50 which might be incorporated into input/output circuit 30 of device 10. In particular, shown in FIG. 2 is a portion of the write path circuit 50 associated with a single one of the eight DQ data input lines DQ0–DQ7; that is, write path circuitry 50 such as is depicted in FIG. 2 would be provided for each of the eight DQ lines DQ0 through DQ7.

As shown in FIG. 2, write path circuit 50 comprises an input buffer 52 coupled to the DQ data input pin of device 10. The output of buffer 52 is applied to a delay element 54 adapted to introduce a delay in the propagation of data signals appearing at the output of input buffer 52. Preferably, the delay interval of delay element 54 is variable, and delay element 54 may be implemented in any of various well-known ways, such as with an resistor/capacitor (RC) delay circuit, a succession of inverters, NAND or other logic gates, or some combination thereof, in accordance with common practice in the art. Various delay elements, both fixed and variable, are known in the art; see, for example, U.S. Pat. No. 6,137,334 to Miller Jr. et al., entitled "Logic Circuit Delay Stage and Delay Line Utilizing Same." The Miller Jr. '334 patent is commonly assigned to the assignee of the present invention and is hereby incorporated by reference herein in its entirety.

The delayed data signal presented at the output of delay element 54, in turn, is applied to respective inputs of first and second pass gates 56 and 58. Pass gates 56 and 58 each function to selectively allow the data appearing at their respective inputs to be presented at their respective outputs under control of the data strobe (clock) signal QS/QS* applied to their control inputs. (In accordance with conventional nomenclature, as used herein the presence of an asterisk ("*") following a logical signal denotes the signal's logical (binary) complement.)

As will be appreciated by those of ordinary skill in the art, the data strobe signal QS/QS* is preferably derived from an externally-applied clock (CLK) signal that is among those mentioned above as part of the control signals applied to control circuit 12. In a typical implementation, the data strobe signal QS/QS* is generated by a clocking circuit such as a delay-lock-loop (DLL) circuit described generally above, and which for the purposes of the present disclosure is considered part of the control circuit 12. As such, the QS/QS* signal will likely closely follow the externally-applied CLK signal, possibly with a propagation delay with respect to the externally-applied CLK signal. (For clarity, the connections between such clocking circuitry in control circuit 12 and the various synchronous subcircuits of device 10 are not shown in FIG. 1. Those of ordinary skill in the art will appreciate the necessity and nature of such signal routing.)

Figure 3:
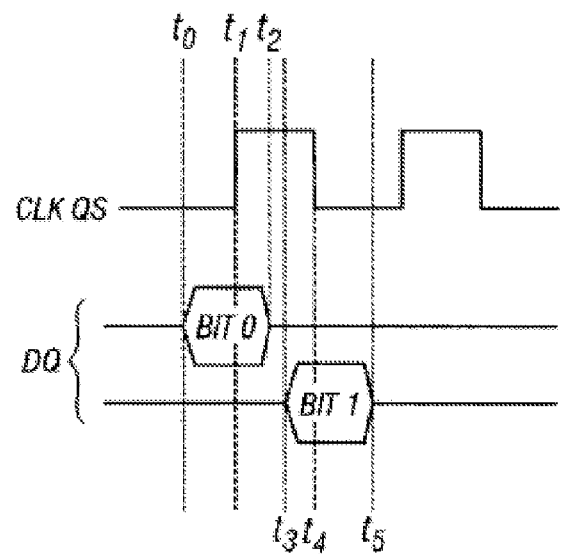
FIG. 3 is a timing diagram illustrating the timing of certain logic signals present in the write data path circuitry from FIG. 2.

As a result of the arrangement shown in FIG. 2, those of ordinary skill will observe that upon the occurrence of a rising edge in data strobe signal QS (and hence a falling edge in the complementary data strobe signal QS*), such as is shown occurring at time to in FIG. 3, the delayed data signal output from delay element 54 will pass through to the output of pass gate 56 (i.e., pass gate 56 will "open") but will be blocked from passing through to the output of pass gate 58 (i.e., pass gate 58 will "close"). Conversely, upon the occurrence of a falling edge in data strobe signal QS (and hence a rising edge in complementary data strobe signal QS*), the delayed data signal output from delay element 54 will pass through pass gate 58 (i.e., pass gate 58 will open) and will be blocked by pass gate 56 (i.e., pass gate 56 will close). Because of the complementary nature of strobe signals QS and QS* and as a result of the arrangement shown in FIG. 2, pass gate 56 will not pass data when pass gate 58 does, and, conversely, pass gate 58 will not pass data when pass gate 56 does.

The output of pass gate 56 is presented to a buffer/boost feedback circuit comprising two inverters 60 and 62. Likewise, the output of pass gate 58 is presented to a buffer/boost feedback circuit comprising two inverters 64 and 66. Buffer/boost feedback circuits merely function to improve the overall latching operation of circuit 50 by boosting the outputs of the respective pass gates with which they are associated, as would be appreciated by those of ordinary skill in the art.

Next, the boosted output of pass gate 56 is applied to the input of a pass gate 70, while the boosted output of pass gate 58 is applied to the input of a pass gate 72. Pass gates 70 and 72 receive the complementary data strobe signals QS/QS* and therefore, like pass gates 56 and 58 function essentially as selective pass gates for the outputs of pass gates 56 and 58, respectively.

Turning to FIG. 3, there is shown a timing diagram illustrating operation of the write path circuitry 50 of FIG. 2 as it pertains to the issue of achieving acceptable setup and hold times for data relative to the rising and falling edges of the data strobe signal. As noted above, a rising edge in data strobe signal QS occurs at time $t_1$ in FIG. 3. Prior to time $t_1$, at time $t_0$, data first appears on data input line DQ; thus, the interval from time to $t_0$ time $t_1$ corresponds to the setup interval DS for the first bit (bit 0) to be written to device 10. The bit 0 data is removed from data input line DQ at time $t_2$. Thus, the time interval from time $t_1$ to time $t_2$ corresponds to the hold time DH for the bit 0 data.

At time $t_3$, the falling edge data bit (bit 1) to be written to device 10 appears on the DQ input line. The time interval between $t_3$ and $t_4$, when the falling edge of QS occurs, corresponds to the setup time DS for the bit 1 data. Finally, the bit 1 data is removed from the DQ input line at time $t_5$, making the time interval between times $t_4$ and $t_5$ the hold time DH for the bit 1 data. As will be appreciated by those of ordinary skill in the art, varying the delay interval introduced into the DQ data signal by delay element 54 will result in variation in the timing of the data applied to the inputs of pass gates 56 and 58 relative to the rising and falling edges of data strobe signals QS/QS*, thereby varying the setup and hold times of the data relative to the data strobe signals.

As an illustrative example, assume that a combined setup and hold time for memory device 10 is specified to be no greater than 1 nSec, i.e., DS+DH≦1 nSec. Assume further that the following timing is observed in the example shown in FIG. 3:

For Bit 0 (Rising Edge Data):

$DS=t_1-t_0=600\ pSec$ $DH=t_2-t_1=200\ pSec$ $DS+DH=800\ pSec$

For Bit 1 (Falling Edge Data):

$DS=t_4-t_3=200\ pSec$ $DH=t_5-t_4=600\ pSec$ $DS+DH=800\ pSec$

In this example, since the total DS+DH for each bit is less than 1 nSec, the part technically meets the specification for either individual bit in the DDR write operation. However, those of ordinary skill in the art will appreciate that for the purposes of determining whether a DDR part meets its specification, the worst case values for both setup and hold times are used, regardless of which bit they are associated with. In this example, the worst-case setup is that for bit 0, namely 600 pSec, and the worst case hold is that for bit 1, also 600 pSec. Thus, the worst-case DS+DH is 1200 pSec, which does not meet the hypothetical 1 nSec specification.

Unfortunately, delay element 54, even if adjustable, cannot be used to bring the part into specification, since adjusting delay element 54 to improve the worst case setup will necessarily increase the worst case hold, and vice versa. The present invention seeks to overcome this problem.

Figure 4:
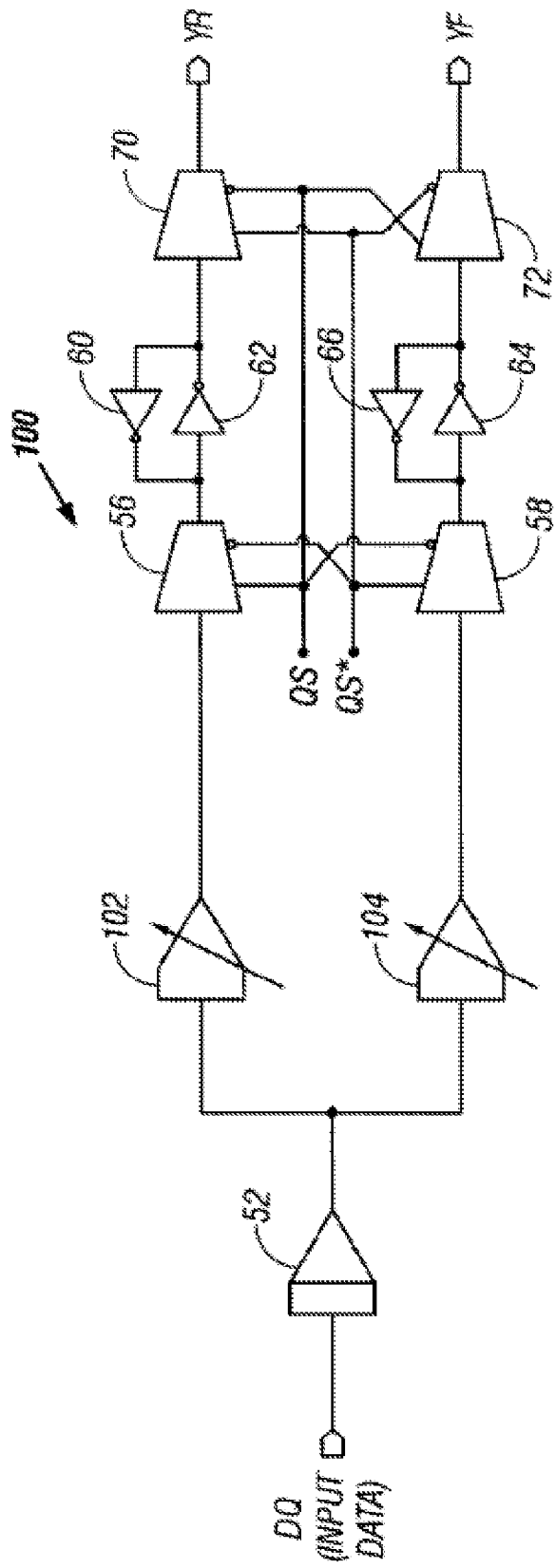
FIG. 4 is a schematic/block diagram of write data path circuitry in accordance with one embodiment of the invention.

Turning to FIG. 4, there is shown a portion of write path circuitry 100 in accordance with one embodiment of the invention. As with FIG. 2, the portion of write path circuitry 100 shown in FIG. 4 is part of input/output circuit 30 in FIG. 1, and, as with FIG. 2, the circuitry 100 in FIG. 4 is provided for each input/output (DQ) pin of device 10. It is to be noted that elements of write path circuitry 100 in FIG. 4 that are essentially identical to corresponding elements in write path circuitry 50 in FIG. 2 retain identical reference numerals in FIG. 4.

As shown in FIG. 4, write path circuitry 100 comprises the same input buffer 52, the same pass gates 56, 58, 70, and 72 and the same buffer/boost inverter pairs 60/62 and 64/66 as circuit 50 from FIG. 2. In addition, however, circuit 100 incorporates a pair of adjustable delay elements 102 and 104. Like delay element 54 in the circuit of FIG. 1, delay elements 102 are adapted to introduce a delay into the propagation of data signals applied to their inputs in a conventional manner. The delayed data signal output of adjustable delay 102 is applied to the input of pass gate 56, whereas the delayed data signal output of adjustable delay 104 is applied to the input of pass gate 58. It will be apparent to those of ordinary skill in the art that by providing separate delays for the rising edge data path (pass gates 56 and 70) and the falling edge data path (pass gates 58 and 72), the delay in the arrival of the DQ data signal at the input of pass gate 56 can be different than the delay in the arrival of the DQ data signal at the input of pass gate 58. Thus, in accordance with an important feature of the present invention, the worst-case setup and hold times for rising edge data can be optimized independently from the worst-case setup and hold times for the falling edge data.

In an alternative embodiment of the invention, an additional variable delay element (not shown in FIG. 4) is provided at the output of data buffer 52. Adjustment of such a delay element's delay interval would introduce a delay in the propagation of both the rising and falling edge data, just as does delay element 54 in the write path circuit of FIG. 1.

Although the embodiment of FIG. 4 overcomes the problems arising from the inability to improve the worst-case setup and hold timings independently for the rising and falling edge bits during a DDR write operation, it may be undesirable to provide two separate delay elements for each data line, due to the amount of area such delay elements might occupy on the semiconductor substrate. To address this consideration, an alternative embodiment of the invention, shown in FIG. 5, is contemplated.

Figure 5:
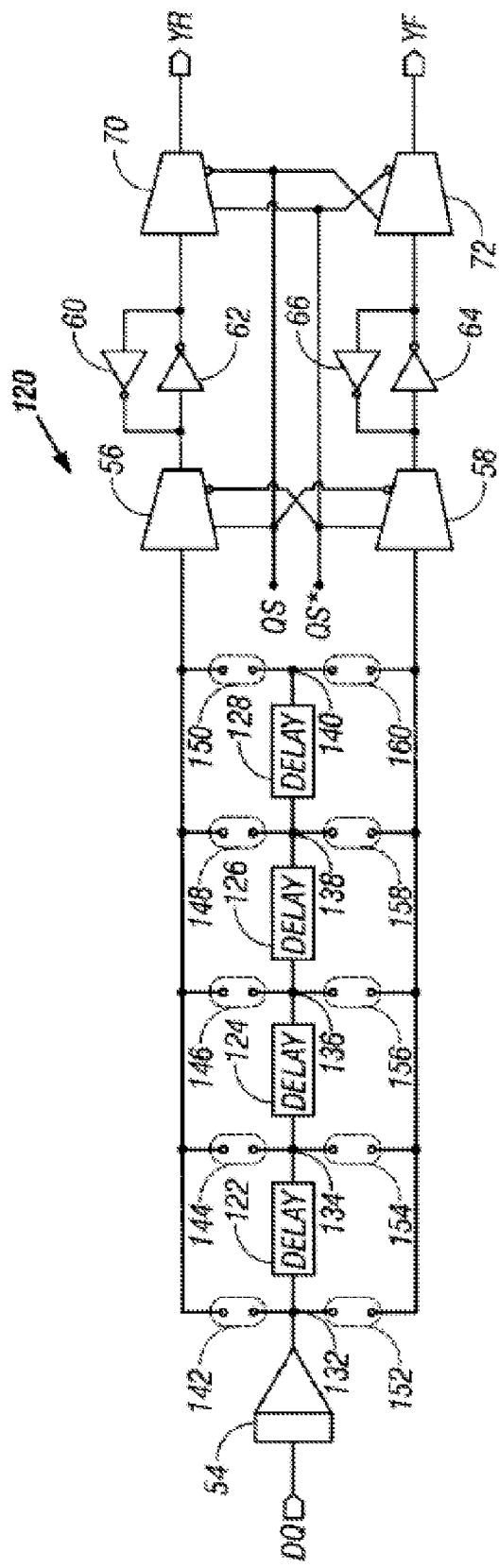
FIG. 5 is a schematic/block diagram of write data path circuitry in accordance with an alternative embodiment of the invention.

Referring to FIG. 5, there is shown a portion of write path circuitry 120 associated with an input/output (DQ) line in the memory device 10 of FIG. 1. It is to be understood that elements in write path circuit 120 which are essentially identical to those in FIGS. 1 and 4 retain identical reference numerals in FIG. 5. As shown, circuit 120 comprises data input buffer 54, pass gates 56, 58, 70, and 72, and bufffer/boost inverter pairs 60/62 and 64/66 as in the embodiments of FIGS. 1 and 4.

In addition, write path circuit 120 comprises a network of series-connected delay elements 122, 124, 126, and 128 coupled to the output of data buffer 54. (Although four delay elements are shown in the embodiment of FIG. 5, those of ordinary skill in the art having the benefit of the present disclosure will readily appreciate that more or fewer delay elements may be utilized.) In one embodiment, series-connected delay elements 122, 124, 126, and 128 are fixed delay elements, for example, implemented in the form of one or more field effect transistor gates, as would be familiar to those of ordinary skill in the art. In one embodiment, delay elements 122, 124, 126, and 128 each introduce the same amount of delay into signal propagation.

As shown in FIG. 5, a plurality of tap points 132, 134, 136, 138, and 140 are defined on either end of and between successive pairs of the series-connected delay elements 122, 124, 126, and 128. Each tap point 132–140 is capable of being shunted either to the input of rising edge data pass gate 56 or to the input of falling edge data pass gate 58. The possible shunt locations are identified with reference numerals 142–160 in FIG. 5. Depending upon which shunts are selected, zero or more of the delay elements 122, 124, 126, and 128 are coupled between the output of buffer 54 and either the input of pass gate 56 (in the case of shunt locations 142–150) or the input of pass gate 58 (in the case of shunt locations 152–160). In one embodiment, the shunts are selected as mask options that are selected during fabrication of the device. Alternatively, it is contemplated that the shunts could be implemented as anti-fuses or the like. In any case, those of ordinary skill in the art will observe from FIG. 5 that shunts 142–150 will result in different delay values for the rising edge data before application to pass gate 56, whereas shunts 152–160 will result in different delay values for the falling edge data before application to pass gate 58. In the embodiment of FIG. 5, at least one shunt 142–150 must be made and at least one shunt 152–160 must be made for proper operation.

In the disclosed embodiment, each series-connected delay element 122, 124, 126, and 128 introduces one "unit" of delay into signal propagation. (However, it is contemplated in an alternative embodiment that the delay elements may each introduce different amounts of delay into signal propagation. For example, delay elements 122, 124, 126, and 128 may correspond to successively smaller or successively larger delays). For the rising edge bit, shunt 142 between tap point 132 and pass gate 56 would result in no delay in the DQ data before propagation to pass gate 56. Shunt 144 would result in the introduction of one unit of delay (delay element 122) into propagation of the DQ data. Shunt 146 would result in the introduction of two units of delay (delay elements 122 and 124) into DQ signal propagation. Shunt 148 would result in the introduction of three units of delay (delay elements 122, 124, and 126) into signal propagation. Finally, shunt 150 would result in the introduction of four units of delay (delay elements 122, 124, 126, and 128) into DQ signal propagation. Likewise, zero, one, two, three, or four units of delay can be introduced into propagation of falling edge data, depending upon whether shunt 152, 154, 156, 158, or 160, respectively, is made. Advantageously, although separate and different delays are achieved for the rising and falling edge data, the same delay elements 122, 124, 126, and 128 are utilized for both rising and falling edge delay, thereby conserving chip space.

From the foregoing detailed description of specific embodiments of the invention, it should be apparent that write path circuitry for a double-data-rate synchronous DRAM has been disclosed in which the setup and hold times for the write data is independently adjustable for rising and falling edge data. Although specific embodiments of the invention have been disclosed herein in some detail, this has been done solely for the purposes of describing various features and aspects of the invention, and is not intended to be limiting with respect to the scope of the invention. It is contemplated that various substitutions, alterations, and/or modifications may be made to the disclosed embodiment, including but not limited to those implementation variations which may have been suggested herein, may be made to the disclosed embodiments without departing from the spirit and scope of the invention as defined by the appended claims, which follow.

What is claimed is:

1. A write path circuit for a synchronous memory, comprising:
   a first delay circuit having an input coupled to a data signal for generating a first delayed data signal;
   a second delay circuit having an input coupled to the data signal for generating a second delayed data signal;
   a first transmission circuit for passing the first delayed data signal to a rising edge write data line upon the assertion of a strobe signal; and
   a second transmission circuit for passing the second delayed data signal to a falling edge write data line upon the assertion of the inverse of the strobe signal.

2. The circuit of claim 1, further comprising an input buffer for outputting the data signal.

3. The circuit of claim 1, wherein at least one of the first or second delay circuits is adjustable to adjust the delay between the first delayed data signal and the second delayed data signal.

4. The circuit of claim 1, wherein at least one of the first or second delay circuits is adjusted to adjust the delay between the first delayed data signal and the second delayed data signal.

5. The circuit of claim 1, wherein the first delayed data signal is differently delayed from the second delayed data signal.

6. The circuit of claim 1, wherein the first and second delay circuits comprise a plurality of series-connected delay elements.

7. The circuit of claim 1, wherein the strobe signal is derived from a clock signal applied externally to the memory device.

8. The circuit of claim 1, wherein each of the first and second transmission circuits comprises a pass gate.

9. The circuit of claim 1, wherein each of the first and second transmission circuits comprises at least one pass gate and a latch.

10. The circuit of claim 1, wherein each of the first and second transmission circuits comprises, in serial connection:
    a first pass gate;
    a latch; and
    a second pass gate.

11. The circuit of claim 10, wherein the first pass gate in the first transmission circuit and the second pass gate in the second transmission circuit are activated upon assertion of the inverse of the strobe signal, and wherein the second pass gate in the first transmission circuit and the first pass gate in the second transmission circuit are activated upon assertion of the strobe signal.

12. A write path circuit for a synchronous memory, comprising:
- a delay circuit having an input coupled to a data signal for generating a first and a second delayed data signal, wherein the first and second delayed data signals are differently delayed by the delay circuit;
- a first transmission circuit for passing the first delayed data signal to a rising edge write data line upon the assertion of a strobe signal; and
- a second transmission circuit for passing the second delayed data signal to a falling edge write data line upon the assertion of the inverse of the strobe signal.

13. The circuit of claim 12, further comprising an input buffer for outputting the data signal.

14. The circuit of claim 12, wherein a delay of at least one of the first or second delay circuits is adjustable to adjust the delay between the first delayed data signal and the second delayed data signal.

15. The circuit of claim 12, wherein a delay of at least one of the first or second delay circuits is adjusted to adjust the delay between the first delayed data signal and the second delayed data signal.

16. The circuit of claim 12, wherein the delay circuit comprises a plurality of series-connected delay elements.

17. The circuit of claim 12, wherein the strobe signal is derived from a clock signal applied externally to the memory device.

18. The circuit of claim 12, wherein each of the first and second transmission circuits comprises a pass gate.

19. The circuit of claim 12, wherein each of the first and second transmission circuits comprises at least one pass gate and a latch.

20. The circuit of claim 12, wherein each of the first and second transmission circuits comprises, in serial connection:
- a first pass gate;
- a latch; and
- a second pass gate.

21. The circuit of claim 20, wherein the first pass gate in the first transmission circuit and the second pass gate in the second transmission circuit are activated upon assertion of the inverse of the strobe signal, and wherein the second pass gate in the first transmission circuit and the first pass gate in the second transmission circuit are activated upon assertion of the strobe signal.

22. A write path circuit for a synchronous memory, comprising:
- a delay circuit having an input coupled to a data signal for generating a first and a second delayed data signal, wherein the delay of the first and second delayed data signals are adjustable by the delay circuit;
- a first transmission circuit for passing the first delayed data signal to a rising edge write data line upon the assertion of a strobe signal; and
- a second transmission circuit for passing the second delayed data signal to a falling edge write data line upon the assertion of the inverse of the strobe signal.

23. The circuit of claim 22, further comprising an input buffer for outputting the data signal.

24. The circuit of claim 22, wherein at least one of the first or second delay circuits is adjusted to adjust the delay between the first delayed data signal and the second delayed data signal.

25. The circuit of claim 22, wherein the first delayed data signal is differently delayed from the second delayed data signal.

26. The circuit of claim 22, wherein the delay circuit comprises a plurality of series-connected delay elements.

27. The circuit of claim 22, wherein the strobe signal is derived from a clock signal applied externally to the memory device.

28. The circuit of claim 22, wherein each of the first and second transmission circuits comprises a pass gate.

29. The circuit of claim 22, wherein each of the first and second transmission circuits comprises at least one pass gate and a latch.

30. The circuit of claim 22, wherein each of the first and second transmission circuits comprises, in serial connection:
- a first pass gate;
- a latch; and
- a second pass gate.

31. The circuit of claim 30, wherein the first pass gate in the first transmission circuit and the second pass gate in the second transmission circuit are activated upon assertion of the inverse of the strobe signal, and wherein the second pass gate in the first transmission circuit and the first pass gate in the second transmission circuit are activated upon assertion of the strobe signal.

32. A write path circuit for a double-data-rate synchronous memory, comprising:
- an input buffer having a data input and an output;
- a first delay element having an input coupled to the output of the input buffer and having an output, the first delay element responsive to a data signal at the output of the input buffer to generate a first delayed data signal;
- a second delay element having an input coupled to the output of the input buffer and having an output, the second delay element responsive to the data signal at the output of the input buffer to generate a second delayed data signal;
- a first pass gate having an input coupled to the output of the first delay element, an output, and at least one control input; and
- a second pass gate having an input coupled to the output of the second delay element, an output, and at least one control input,
- wherein the first pass gate is responsive to a rising edge in at least one data strobe signal applied to the at least one control input thereof to present the first delayed data signal on the first pass gate output,
- and wherein the second pass gate is responsive to a falling edge in the at least one data strobe signal applied to the at least one control input thereof to present the second delayed data signal on the second pass gate output.

33. The write path circuit of claim 32, wherein the first and second delay elements are adjustable to introduce a range of delay intervals into data signals propagated therethrough.

34. The write path circuit of claim 33, wherein the first and second delay elements are adjusted to achieve a predetermined timed relationship between the first delayed data signal, the second delayed data signal, the rising edge, and the falling edge.

35. The write path circuit of claim 32, further comprising:
- a third pass gate having an input coupled to the output of the first pass gate, an output, and at least one control signal input, the third pass gate being responsive to the first delayed data signal on the first pass gate output and to the at least one control data strobe signal to generate a rising edge data signal on an output of the third pass gate; and
- a fourth pass gate having an input coupled to the output of the second pass gate, an output, and at least one control signal input, the fourth pass gate being responsive to the second delayed data signal on the second pass gate output and to the at least one control data strobe signal to generate a falling edge data signal on an output of the fourth pass gate.

36. The write path circuit of claim 32, wherein the at least one data strobe signal comprises a data strobe signal and its logical complement.

37. The write path circuit of claim 36, wherein the data strobe signal is derived from a clock signal applied externally to the memory device.

38. A write path circuit for a synchronous semiconductor memory device, comprising:
   an input buffer having a data input and an output;
   a delay circuit having an input coupled to the output of the input buffer and having a first output and a second output, the delay circuit responsive to a data signal at the output of the input buffer to generate a first delayed data signal on the first output and a second delayed data signal on the second output,
   a first pass gate having an input coupled to the first output of the delay circuit, an output, and at least one control input; and
   a second pass gate having an input coupled to the second output of the delay circuit, an output, and at least one control input,
   wherein the first pass gate is responsive to a rising edge in at least one data strobe signal applied to the at least one control input thereof to present the first delayed data signal on the first pass gate output,
   and wherein the second pass gate is responsive to a falling edge in the at least one data strobe signal applied to the at least one control input thereof to present the second delayed data signal on the second pass gate output.

39. The write path circuit of claim 38, wherein the first delayed data signal corresponds to the data signal delayed by a first delay interval and the second delayed data signal corresponds to the data signal delayed by a second delay interval different than the first delay interval.

40. The write path circuit of claim 39, wherein the first and second delay intervals are adjusted to achieve a predetermined timed relationship between the first delayed data signal, the second delayed data signal, the rising edge, and the falling edge.

41. The write path circuit of claim 38, further comprising:
   a third pass gate having an input coupled to the output of the first pass gate, an output, and at least one control signal input, the third pass gate being responsive to the first delayed data signal on the first pass gate output and to the at least one control data strobe signal to generate a rising edge data signal on an output of the third pass gate; and
   a fourth pass gate having an input coupled to the output of the second pass gate, an output, and at least one control signal input, the fourth pass gate being responsive to the second delayed data signal on the second pass gate output and to the at least one control data strobe signal to generate a falling edge data signal on an output of the fourth pass gate.

42. The write path circuit of claim 38, wherein the at least one data strobe signal comprises a data strobe signal and its logical complement.

43. The write path circuit of claim 42, wherein the data strobe signal is derived from a clock signal applied externally to the memory device.

44. The write path circuit of claim 38, wherein the delay circuit comprises:
   a plurality of series-connected delay elements coupled to the input buffer output, the plurality of series-connected delay elements defining a plurality of tap points between successive pairs of the delay elements,
   wherein the first delay circuit output is coupled to a first of the tap points and the second delay circuit output is coupled to a second of the tap points.

45. The write path circuit of claim 44, wherein the first of the tap points and the second of the tap points are the same tap point.

46. A method of operating a write path circuit of a synchronous memory device, comprising:
   applying a sequence of data bits to a first delay circuit and a second delay circuit to derive first and second delayed data signals;
   applying the first delayed data signal to a first transmission circuit and the second delayed data signal to a second transmission circuit;
   passing the first delayed data signal to a rising edge write data line upon the assertion of a strobe signal; and
   passing the second delayed data signal to a falling edge write data line upon the assertion of the inverse of the strobe signal.

47. The method of claim 46, wherein an input buffer outputs the sequence of data bits.

48. The method of claim 47, wherein the input buffer receives the sequence of data bits from an external pin on the memory device.

49. The method of claim 46, wherein at least one of the first or second delay circuits is adjustable to adjust the delay between the first delayed data signal and the second delayed data signal.

50. The method of claim 46, wherein at least one of the first or second delay circuits is adjusted to adjust the delay between the first delayed data signal and the second delayed data signal.

51. The method of claim 46, wherein the first delayed data signal is differently delayed from the second delayed data signal.

52. The method of claim 46, wherein the strobe signal is derived from a clock signal applied externally to the memory device.

53. The method of claim 46, wherein the first and second delayed data signals are passed to their respective write data lines through respective first and second transmission circuits.

54. The method of claim 53, wherein each of the first and second transmission circuits comprises a pass gate.

55. The method of claim 53, wherein each of the first and second transmission circuits comprises at least one pass gate and a latch.

56. The method of claim 53, wherein each of the first and second transmission circuits comprises, in serial connection:
   a first pass gate;
   a latch; and
   a second pass gate.

57. The method of claim 56, wherein the first pass gate in the first transmission circuit and the second pass gate in the second transmission circuit are activated upon assertion of the inverse of the strobe signal, and wherein the second pass gate in the first transmission circuit and the first pass gate in the second transmission circuit are activated upon assertion of the strobe signal.

58. The method of claim 46, wherein a portion of the first delayed data signal passed to the rising edge write data line comprises a first bit in the sequence of data bits, and wherein a portion of the second delayed data signal passed to the falling edge write data line comprises a second bit in the sequence of data bits.

59. A method of operating a write path circuit of a synchronous memory device, comprising:
  applying a sequence of data bits to a delay circuit;
  deriving a first delayed data signal and a second delayed data signal from the delay circuit, wherein the first and second delayed data signals are differently delayed by the delay circuit;
  passing the first delayed data signal to a rising edge write data line upon the assertion of a strobe signal; and
  passing the second delayed data signal to a falling edge write data line upon the assertion of the inverse of the strobe signal.

60. The method of claim 59, wherein an input buffer outputs the sequence of data bits.

61. The method of claim 60, wherein the input buffer receives the sequence of data bits from an external pin on the memory device.

62. The method of claim 59, wherein a delay of at least one of the first or second delay circuits is adjustable to adjust the delay between the first delayed data signal and the second delayed data signal.

63. The method of claim 59, wherein a delay of at least one of the first or second delay circuits is adjusted to adjust the delay between the first delayed data signal and the second delayed data signal.

64. The method of claim 59, wherein the strobe signal is derived from a clock signal applied externally to the memory device.

65. The method of claim 59, wherein the first and second delayed data signals are passed to their respective write data lines through respective first and second transmission circuits.

66. The method of claim 65, wherein each of the first and second transmission circuits comprises a pass gate.

67. The method of claim 65, wherein each of the first and second transmission circuits comprises at least one pass gate and a latch.

68. The method of claim 65, wherein each of the first and second transmission circuits comprises, in serial connection:
  a first pass gate;
  a latch; and
  a second pass gate.

69. The method of claim 68, wherein the first pass gate in the first transmission circuit and the second pass gate in the second transmission circuit are activated upon assertion of the inverse of the strobe signal, and wherein the second pass gate in the first transmission circuit and the first pass gate in the second transmission circuit are activated upon assertion of the strobe signal.

70. The method of claim 59, wherein a portion of the first delayed data signal passed to the rising edge write data line comprises a first bit in the sequence of data bits, and wherein a portion of the second delayed data signal passed to the falling edge write data line comprises a second bit in the sequence of data bits.

71. A method of operating a write path circuit of a synchronous memory device, comprising:
  applying a sequence of data bits to a delay circuit;
  deriving a first delayed data signal and a second delayed-data signal from the delay circuit, wherein the delay of the first and second delayed data signals are adjustable by the delay circuit;
  passing the first delayed data signal to a rising edge write data line upon the assertion of a strobe signal; and
  passing the second delayed data signal to a falling edge write data line upon the assertion of the inverse of the strobe signal.

72. The method of claim 71, wherein an input buffer outputs the sequence of data bits.

73. The method of claim 72, wherein the input buffer receives the sequence of data bits from an external pin on the memory device.

74. The method of claim 71, wherein at least one of the first or second delay circuits is adjusted to adjust the delay between the first delayed data signal and the second delayed data signal.

75. The method of claim 71, wherein the first delayed data signal is differently delayed from the second delayed data signal.

76. The method of claim 71, wherein the strobe signal is derived from a clock signal applied externally to the memory device.

77. The method of claim 71, wherein the first and second delayed data signals are passed to their respective write data lines through respective first and second transmission circuits.

78. The method of claim 77, wherein each of the first and second transmission circuits comprises a pass gate.

79. The method of claim 77, wherein each of the first and second transmission circuits comprises at least one pass gate and a latch.

80. The method of claim 77, wherein each of the first and second transmission circuits comprises, in serial connection:
  a first pass gate;
  a latch; and
  a second pass gate.

81. The method of claim 80, wherein the first pass gate in the first transmission circuit and the second pass gate in the second transmission circuit are activated upon assertion of the inverse of the strobe signal, and wherein the second pass gate in the first transmission circuit and the first pass gate in the second transmission circuit are activated upon assertion of the strobe signal.

82. The method of claim 71, wherein a portion of the first delayed data signal passed to the rising edge write data line comprises a first bit in the sequence of data bits, and wherein a portion of the second delayed data signal passed to the falling edge write data line comprises a second bit in the sequence of data bits.

83. A method of operating a write path circuit of a synchronous double-data rate memory device, comprising:
  applying a clock signal to a clock terminal of the memory device;
  deriving, within the memory device, at least one data strobe signal from the clock signal;
  applying a data signal comprising a sequence of data bits to at least one data terminal of the memory device;
  receiving the data signal in a data buffer;
  applying contents of the data buffer to a first delay element and a second delay element to derive first and second delayed data signals;
  applying the first delayed data signal to a first pass gate input and the second delayed data signal to a second pass gate input;
  opening the first pass gate and closing the second pass gate in response to a rising edge in the at least one data strobe signal; and
  closing the first pass gate and opening the second pass gate in response to a falling edge in the at least one data strobe signal.

84. The method of claim 83, further comprising initially adjusting the first and second delay element delay intervals.

85. The method of claim 84, wherein the first and second delay element delay intervals are adjusted to achieve a predetermined timed relationship between the first delayed data signal, the second delayed data signal, the rising edge, and the falling edge.

86. A method of adjusting a setup and hold window of a data signal relative to a data strobe signal in a synchronous semiconductor memory device, wherein the data signal comprises first and second bits of data applied in succession to a data input terminal of the semiconductor memory device, and wherein the data strobe signal comprises a signal having a rising edge and a falling edge, the method comprising:

buffering the data signal in a data buffer having an output;

applying the buffered data signal to a first delay element and to a second delay element to derive first and second delayed data signals each comprising first and second bits of data appearing in succession on respective first and second delayed data lines; and adjusting the first delay element such that appearance of the first bit of data appears on the first delayed data lines in a predetermined timed relationship with the rising edge, and adjusting the second delay element such that the second bit of data appears on the second delayed data line in a predetermined timed relationship with the falling edge.

* * * * *